United States Patent [19]

Jester et al.

[11] Patent Number: 5,248,530
[45] Date of Patent: Sep. 28, 1993

[54] HEAT SEALABLE COEXTRUDED LCP FILM

[75] Inventors: Randy D. Jester; Detlef K. M. Frank, both of Greer, S.C.

[73] Assignee: Hoechst Celanese Corp., Somerville, N.J.

[21] Appl. No.: 800,774

[22] Filed: Nov. 27, 1991

[51] Int. Cl.⁵ .............................................. B32B 9/00
[52] U.S. Cl. ........................................ 428/1; 428/210
[58] Field of Search .................................. 428/1, 210

[56] References Cited

U.S. PATENT DOCUMENTS

| | | | |
|---|---|---|---|
| 4,384,016 | 5/1983 | Ide et al. | 428/1 |
| 4,738,880 | 4/1988 | Asada et al. | 428/1 |
| 4,985,285 | 1/1991 | Ichikawa et al. | 428/1 |

Primary Examiner—Patrick J. Ryan
Assistant Examiner—Cathy Lee
Attorney, Agent, or Firm—Joseph M. Mazzarese

[57] ABSTRACT

A coextruded liquid crystal polymer ("LCP") film or sheet wherein a higher melting LCP layer is laminated to a lower melting LCP layer. These LCP components are coextruded from the same die. This film or sheet may then be laminated onto other materials at a temperature between the melting point of the lower-melting LCP and the higher-melting LCP, so that the latter LCP may maintain its shape, orientation, and mechanical characteristics while the lower-melting LCP component flows and bonds with the other material. When the higher-melting LCP layer is sandwiched between two lower-melting layers, the film or sheet may be laminated on two sides thereof.

16 Claims, No Drawings

HEAT SEALABLE COEXTRUDED LCP FILM

BACKGROUND OF THE INVENTION

This invention relates to the field of polymer films, particularly thermotropic liquid crystalline polymer ("LCP") films.

A variety of thermotropic liquid crystal polymers and films made therefrom are known in the art. For example, U.S. Pat. No. 4,161,470 discloses a polyester of 6-hydroxy-2-naphthoic acid and p-hydroxy benzoic acid capable of undergoing melt processing, U.S. Pat. No. 4,184,996 discloses melt processible thermotropic wholly aromatic polyesters, and U.S. Pat. No. 4,279,803 discloses a polyester of phenyl-4-hydroxybenzoic and 4-hydroxybenzoic acid and/or 6-hydroxy-2-naphthoic acid.

Other patents disclosing LCPs include U.S. Pat. Nos. 3,991,013, 3,991,014, 4,057,597, 4,066,620, 4,067,852, 4,075,262, 4,083,829, 4,093,595, 4,118,372, 4,130,545, 4,219,461, 4,267,289, 4,276,397, 4,330,457, 4,339,375, 4,341,688, 4,351,917, 4,351,918, 4,355,132, 4,355,133, 4,371,660, 4,375,530, 4,460,735, 4,460,736, 4,473,682, 4,489,190, 4,581,443, 4,671,969, 4,673,591, 4,726,998, 4,752,643, 4,770,777, 4,772,421, 4,857,255, 4,898,924, and 4,913,867.

The disclosures of all the aforementioned patents are herein incorporated by reference.

Liquid crystalline polymer film or sheet has a number of well-known applications, including some that involve a lamination process. Examples include tape winding composite structures, cross lamination to provide balanced mechanical properties or thick structures, metal lamination for circuits, or lamination of circuit/dielectric layers for multilayer circuit boards.

Due to the particular molecular structure of thermotropic liquid crystal polymers, LCP film can be molecularly oriented in the melt phase, uniaxially, biaxially, or otherwise. After the extruded LCP cools and solidifies, the molecular orientation is maintained, resulting in a film having anisotropic properties, such as enhanced mechanical properties in the direction(s) of orientation, e.g. high strength and stiffness.

LCP films may be laminated together, or laminated to other materials. Typically, to obtain good adhesion this process involves heating the LCP until it melts and flows to produce a bond between the laminated layers. Unfortunately, when an LCP is heated above its softening or melting point its molecular orientation and overall shape tend to change as the polymer flows. For this reason, it is difficult to laminate a film of LCP while keeping constant its orientation and properties.

U.S. Pat. No. 4,384,016 discloses a multiaxially oriented laminate composed of uniaxially oriented LCP sheets. The sheets are thermally bonded together with their orientation in different directions to provide multiaxially LCP properties.

SUMMARY OF THE INVENTION

The present invention comprises a multi-component liquid crystal polymer ("LCP") film or sheet wherein a higher melting LCP is enclosed in or sandwiched between layers of a lower melting LCP. These LCP components are coextruded from the same die. This film or sheet may then be laminated onto other materials at a temperature between the melting point of the outer lower-melting LCP and the inner higher-melting LCP, so that the inner LCP may maintain its shape, orientation, and mechanical characteristics while the outer LCP component flows and bonds with the other material. It is also within the scope of the present invention to make a two layer construction of the two polymers, resulting in a film having a heat-sealable side made of the lower-melting LCP and a side made of the higher-melting LCP. Constructions having more than two layers, but only one heat sealable side, may also be made if desired.

The coextruded LCP film or sheet may be produced by using a combining block to combine the polymer components before they enter the die, or by using a multi-manifold die. The layers may be arranged in a flat, annular, or other configuration. More than three layers and/or more than two polymer components may be used. Optionally, additional interior layers containing reground material may be included.

After the film has been extruded, orientation may be produced in any conventional manner; for example, drawdown will orient the LCP layers in the machine direction, while transverse stretching will orient them in the transverse direction. Machine shear orientation may also occur due to conventional machine direction flow, or due to moving die surfaces, e.g. in rotating or counter-rotating annular dies. Machine shear orientation will be mainly confined to the outer layers, since inner layers will have been insulated from contact with the die surfaces.

It is an object of the present invention to provide an LCP film or sheet that may be laminated onto a material without compromising the mechanical properties of the LCP film or sheet.

It is another object of the present invention to provide an LCP film suitable for multilayer laminates, e.g., circuit boards.

It is yet another object of this invention to provide an LCP film suitable for tape winding or simultaneous melt consolidation applications.

It is also an object of this invention to provide a coextruded LCP film comprising a combination of a lower melting LCP and a higher melting LCP.

It is a further object of the present invention to provide a method for laminating an LCP film or sheet to another object without destroying the LCP structure.

Other objects of the present invention will be apparent to those skilled in the art from the following description and the appended claims.

DETAILED DESCRIPTION OF THE PREFERRED EMBODIMENTS

In a preferred embodiment of the present invention, VECTRA ® A polyester and VECTRA ® E polyester are coextruded so that the higher melting E resin (melting point about 350° C.) is sandwiched between layers of A resin (m. p. about 280° C.).

VECTRA ® A polyester comprises 73 mole % of monomer units derived from 4-hydroxybenzoic acid ("HBA") having the formula

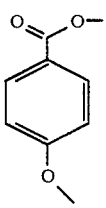

and 27 mole % of monomer units derived from 2,6-hydroxynaphthoic acid ("HNA") having the formula

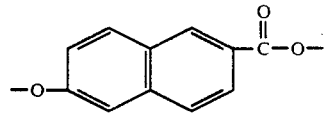

VECTRA ® E polyester comprises 60 mole % of monomer units derived from HBA, 4 mole % of monomer units derived from HNA, 18 mole % of monomer units derived from terephthalic acid ("TA") having the formula

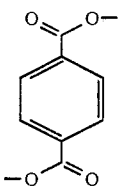

and 18 mole % of monomer units derived from biphenol having the formula

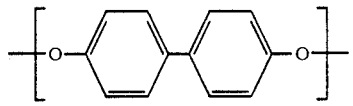

Other preferred embodiments include VECTRA ® C (m. p. about 320° C.) and/or VECTRA ® B polyesters. VECTRA ® C polyester comprises 80 mole % of monomer units derived from HBA and 20 mole % of monomer units derived from HNA VECTRA ® B polyester comprises 60 mole % of monomer units derived from HNA, 20 mole % of monomer units derived from TA, and 20 mole % of monomer units derived from acetaminophen having the formula

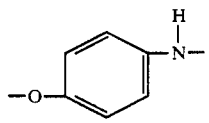

VECTRA ® polyester resins are liquid crystal polymers available from Hoechst Celanese Corporation, having its headquarters in Bridgewater, N.J. There are several different grades of each type of VECTRA; the grades vary in their molecular weight distributions. The melting points stated for the several types of VECTRA may vary, depending upon the specific grade of polymer.

Several combinations of these polyesters can be used to form film or sheet according to the present invention; in every case, a higher melting polymer layer is between lower melting polymer layers. For example, two outer layers of VECTRA A resin could be coextruded with an inner layer of any one of the other VECTRA resins which has a higher melting point than A resin. Those skilled in the art will readily appreciate that many other combinations are possible, since more than three layers and/or more than two different polymers may be coextruded.

It is also within the scope of the present invention to use liquid crystal polymers other than the VECTRA ® polyesters described above. Generally, any such polymers that are able to be coextruded and will bond together may be used in practicing this invention. Examples of such liquid crystal polymers include, but are not limited to, XYDAR ® LCP (a polyester made by Amoco Co. comprising units derived from HBA, TA and 4,4'-biphenol).

The present invention is not limited with respect to the thickness of the layers or of the multi-layer sheet as a whole, nor with respect to the number of layers in the sheet. These variables can be determined based upon need and based upon the capabilities of the equipment that is available.

In one preferred method for making a multi-component film or sheet according to the present invention, two extruders are used to extrude two polymers having different melting points. A combining block is used to guide the polymers into a single die so that the lower melting polymer forms the outermost layers. In another preferred embodiment of this method, a multimanifold die is used instead of the combining block and die. When more than two polymers are used, one extruder is needed for each polymer. The extruders, dies, and combining blocks useful in the practice of the present invention are those well-known to those skilled in the art. It is contemplated that a wide variety of such equipment may be used in various combinations, the choice of which partly will depend upon the polymers that are used and the number and thicknesses of the layers that are desired.

The inner layers of the film or sheet need not all have the same melting point, but at least one inner layer should have a melting point sufficiently higher than the melting point of the two outer layers so that the outer layers may be melted without melting that inner layer. This arrangement of layers allows the outer layers to be melt laminated or bonded to other objects while at least one inner layer maintains its shape, structure, rigidity, and other physical properties. The films of the present invention also may be melt or heat bonded to each other, or folded back on themselves and heat sealed.

The film of the present invention is particularly suited for tape winding or simultaneous consolidation applications. For example, a long strip of film (a tape) having two heat sealable sides may be wound around a template or form so that the film overlaps itself repeatedly; then the film may be heated until the lower-melting polymer in its outer layers melts so that the overlapping film portions seal together to form a rigid structure. The higher-melting core of the film, which is encased in the united mass of lower-melting LCP, maintains its strength, orientation and other characteristics. By crossing such a film over itself in several directions as it is wound, it is possible to create a cross-laminated film that it is strong in multiple directions.

Examples of such other objects to which the film or sheet may be laminated include, but are not limited to, metals (e.g., copper, aluminum, silver, and the like), polymers (either LCP or non-LCP), and semi-conductor materials (e.g., silicon, germanium, and the like). The melt lamination process may be done according to any method known in the art that is suitable for the materials to be laminated; those skilled in the art will be able to select a suitable method.

Although it is preferred to have outer LCP layers that are both made of the same polymer, it is possible to use two different relatively low-melting polymers separated by a higher-melting LCP layer. For example, a layer structure such as C resin/E resin core/A resin could allow stepwise lamination at different temperatures. It is also within the scope of the present invention to create a film that is heat-sealable on only one side, having one surface made of lower-melting polymer and the opposite film surface made of higher-melting polymer (a two-layer construction, for example).

The terms "film" and "sheet" as used herein each refer to any expanse of material, whether a single layer or multiple layers, and are not limited as to thickness or configuration. While these terms often brings to mind a flat shape, the films of the present invention may be otherwise configured; for example, an annular film according to the present invention may be extruded from a die, and this film may be used in that configuration or may be subsequently slit open into a flat or curled sheet without departing from the essence of the present invention.

Whether or not the configuration is flat, the term "outer layer" refers to the layers that are in contact with other LCP layers of the film on one side only, whereas an "inner layer" is contacted by another layer on each side thereof. In the case of an annular configuration, the outer layers include the layer having the largest diameter and that having the smallest diameter; the inner layers are sandwiched between these two outer layers.

Films and other articles made according to the present invention may be oriented in any direction and to any degree, including uniaxially and biaxially. Orientation may be produced in any conventional manner; for example, drawdown will orient the LCP layers in the machine direction, while stretching will orient them in the stretch direction. Machine shear orientation will be mainly confined to the outer layers, since inner layers will have been insulated from contact with the die surfaces.

The following Examples illustrate several embodiments of the present invention. However, the invention should not be construed as limited to the embodiments illustrated.

EXAMPLE I

To determine the compatibility and adhesion between two different coextruded LCP's, the following melt lamination trial was conducted. A sheet of VECTRA® A950 (m.p.=278° C.) and a sheet of VECTRA® E950 (m.p.=350° C.) were placed in a Tetrahedron MP-24 press and melt laminated together at 366° C. Both polymers melted completely while pressed together. Good interlayer adhesion was obtained. The weld line would not separate.

A sheet of VECTRA® E950 (m.p.=350° C.) and a sheet of VECTRA® C950 (m.p.=320° C.) were melt laminated together in the same way at the same press temperature. Again, good adhesion resulted and the layers did not peel apart.

A sheet of VECTRA® A950 (m.p.=278° C.) and a sheet of VECTRA® C950 (m.p.=320° C.) were laminated in the Tetrahedron MP-24 press at 335° C. The layers adhered well to each other and would not separate.

From these results it can be concluded that LCP's of this type may be coextruded to form a multilayer film that will not peel apart.

EXAMPLE II

VECTRA® A910 (m.p.=280° C.) and VECTRA® C910 (m.p. =320° C.) are coextruded using a Cloeren feedblock, with machine direction stretching, to produce a uniaxially oriented high modulus 2 mil thick film for tape winding. The film is extruded so that a 1 mil thick layer of C resin will be sandwiched between two 0.5 mil thick layers of A resin.

After the film is extruded, it is slit into 0.5 inch wide strips. The strips are then wound, using conventional tape winding machinery, onto a form where it is heated at the point of laydown to a temperature between the melting points of the two polymers while tension is maintained on the tape to assure good contact and minimize voids. The A resin melts and flows, causing the overlapping strips to weld together and filling in any voids. The C resin does not melt, however, maintaining its shape and excellent physical characteristics despite the heat and tension applied to it. The resultant structure is lightweight and has excellent barrier characteristics.

EXAMPLE III

The uniaxially oriented coextruded film of Example two is cut into sheets after extrusion, and these sheets are stacked together with their orientations running in different directions; the orientation distribution is symmetrical overall, e.g. 45°, 135°, 0°, and 90°. The number of sheets stacked together depends upon the desired film thickness. This stack is then placed in a press as described in Example I at a temperature of about 294° C. to melt the A-resin and produce a laminated structure with balanced properties (i.e., the properties are the same along any axis in the plane of the film) A non-symmetrical arrangement of oriented layers may also be used if a non-balanced laminate is desired.

EXAMPLE IV

VECTRA® A910 and VECTRA® E950 are coextruded to produce a film having a 5 mil thick core layer of E resin sandwiched between two 0.5 mil thick layers of A resin. A sheet of copper is hot pressed against each outer A resin layer at a temperature of about 295° C. to laminate the copper to the LCP and produce a copper/LCP/copper laminate suitable for electrical circuit production. The E resin core provides good dimensional stability for the circuit at the elevated temperatures commonly used in various soldering operations during circuit production.

EXAMPLE V

VECTRA® A910 and VECTRA® E950 are coextruded to produce a uniaxially oriented film having a 1 mil thick core layer of E resin sandwiched between two 0.5 mil thick layers of A resin. A stack of copper foil and sheets of the extruded film is made in the following order: copper/(45° oriented film)/(0° oriented film)/(90° oriented film)/(135° oriented film)/copper. The stack is laminated together by using a press at 294° C. The resulting multi-layer laminate structure is dimensionally stable at elevated temperatures due to the VECTRA ® E polyester layers and has essentially isotropic physical properties and coefficient of thermal expansion due to its balanced multiaxial orientation.

EXAMPLE VI

The laminate structures made according to the procedure of Example IV or V are used in a multilayer circuit board using a coextruded VECTRA ® dielectric consisting of one or more layers of the coextruded LCP film. The required layers of circuit and dielectric are positioned and stacked in a sandwich structure which is laminated together in a press or autoclave at a temperature which melts A resin, but not E resin. Because only the thin A resin skin melts, the layers can maintain proper circuit registration. The resulting circuit board incorporates the high temperature capabilities of the E resin, good dielectric properties, and the excellent drilling/punching behavior of a non-filled polymer system.

EXAMPLE VII

VECTRA A and E resins are coextruded through an annular die to form a multilayer film; the film is oriented in both the machine and transverse directions using a combination of drawdown and gas inflation to produce a film having a 1 mil core layer of VECTRA ® E950 and two 0.5 mil outer layers of VECTRA ® A910, and having balanced properties. The film is slit open into a flat shape, and one or more pieces of this balanced film are laminated to copper foil to provide a laminate suitable for electrical circuits, which has good high temperature performance, balanced physical properties, and a balanced coefficient of thermal expansion.

Many variations of the present invention will occur to those skilled in the art. The present invention is not limited to the embodiments illustrated and described herein, but encompasses all the subject matter within the scope of the appended claims.

We claim:

1. A multi-layer polymer film or sheet comprising a layer of a first liquid crystal polymer located between two layers of one or more other liquid crystal polymers, said first liquid crystal polymer having a melting point sufficiently higher than the melting point of said other liquid crystal polymers so that said other liquid crystal polymers may be melted without melting said first liquid crystal polymer.

2. A polymer film or sheet according to claim 1 comprising only one said other liquid crystal polymer.

3. A polymer film or sheet according to claim 2 wherein all said liquid crystal polymers are polyesters.

4. A polymer film or sheet according to claim 3 wherein all said polyesters are selected from the group consisting of: a polyester comprising monomer units derived from 4-hydroxybenzoic acid and 2,6-hydroxynaphthoic acid; a polyester comprising monomer units derived from 2,6-hydroxynaphthoic acid, terephthalic acid, and acetaminophen; and, a polyester comprising monomer units derived from 4-hydroxybenzoic acid, terephthalic acid and 4,4'-biphenol.

5. A polymer film or sheet according to claim 1 wherein said film or sheet is flat.

6. A polymer film or sheet according to claim 1 wherein said film or sheet has an annular configuration.

7. A laminated article comprising a film or sheet according to claim 1.

8. A laminated article according to claim 7 wherein said film or sheet is laminated to a layer comprising a metal.

9. A laminated article according to claim 8 wherein said layer comprising metal is copper, silver, or aluminum.

10. A laminated article according to claim 8 comprising a circuit board.

11. A laminated article according to claim 7 wherein said film or sheet is laminated to a layer comprising polymeric material.

12. A laminated article according to claim 7 wherein said film or sheet is laminated to a layer comprising silicon.

13. A laminated article according to claim 7 comprising a circuit board.

14. A laminated article according to claim 7 formed by overlapping portions of said film and then heating said film to bond said film portions together.

15. A polymer film or sheet comprising more than one layer, including two layers that are exposed surface layers, wherein one of said surface layers comprises a first liquid crystal polymer and the other of said surface layers comprises a second liquid crystal polymer, said first liquid crystal polymer having a melting point sufficiently higher than the melting point of said second liquid crystal polymer so that said second liquid crystal polymer may be melted without melting said first liquid crystal polymer.

16. A laminated article comprising a film or sheet according to claim 15.

* * * * *